US006636321B2

(12) United States Patent
Bohnert

(10) Patent No.: US 6,636,321 B2
(45) Date of Patent: Oct. 21, 2003

(54) FIBER-OPTIC CURRENT SENSOR

(75) Inventor: Klaus Bohnert, Oberrohrdorf (CH)

(73) Assignee: ABB Research Ltd, Zurich (CH)

( * ) Notice: Subject to any disclaimer, the term of this patent is extended or adjusted under 35 U.S.C. 154(b) by 45 days.

(21) Appl. No.: 09/848,210

(22) Filed: May 4, 2001

(65) Prior Publication Data

US 2002/0006244 A1 Jan. 17, 2002

(30) Foreign Application Priority Data

May 5, 2000 (DE) .......................................... 100 21 669

(51) Int. Cl.$^7$ ................................................. G01B 9/02
(52) U.S. Cl. ....................................................... 356/483
(58) Field of Search ..................... 356/483; 250/227.19, 250/227.27; 324/96, 95, 97, 76.36; 385/12

(56) References Cited

U.S. PATENT DOCUMENTS

| | | | | |
|---|---|---|---|---|
| 4,516,021 A | * | 5/1985 | Taylor | 250/227.17 |
| 4,652,744 A | * | 3/1987 | Bowers et al. | 250/227.27 |
| 5,051,577 A | | 9/1991 | Lutz et al. | |
| 5,317,384 A | * | 5/1994 | King | 356/477 |
| 5,894,531 A | * | 4/1999 | Alcoz | 250/227.27 |
| 6,166,816 A | * | 12/2000 | Blake | 250/227.27 |
| 6,215,917 B1 | * | 4/2001 | Takahashi et al. | 359/173 |

FOREIGN PATENT DOCUMENTS

| | | |
|---|---|---|
| DE | 2845625 | 4/1980 |
| DE | 3726411 A1 | 2/1989 |
| DE | 4224190 A1 | 1/1994 |
| DE | 19548920 A1 | 7/1996 |
| DE | 19544778 A1 | 6/1997 |
| EP | 0191588 B1 | 8/1986 |
| EP | 0856737 A1 | 8/1998 |
| EP | 0448324 B1 | 5/1999 |
| WO | WO98/08105 | 2/1998 |
| WO | WO98/58268 | 12/1998 |

OTHER PUBLICATIONS

Blake, et al. "In–line Sagnac Interferometer Current Sensor." IEEE Transactions on Power Delivery, vol. 11, No. 1, Jan. 1996.*
In–Line Sagnac Interferometer Current Sensor, J. Blake et al, IEEE Transactions on Power Delivery, vol. 11, No. 1, Jan. 1996, pp. 116–121.
G. Frosio et al., "Reciprocal reflection interferometer for a fiber–optic Faraday current sensor", Applied Optics, vol. 33, No. 25, pp. 6111–6122 (1994).
Magneto–optical Fibre sensors for electrical industry: analysis of performances, S. Donati et al., IEE Proceedings, vol. 135, Pt. J, No. 5, Oct. 1988, pp. 372–382.
G. Frosio et al., "All–fiber Sagnac Current Sensor", Proc. Opto 92, pp. 560–564 (1992) and EP–A–0 856 737.
H.C. Lefevre, "fiber–optic gyroscopes", Fiber–Optic Sensors, J. Dakin and B. Culshaw Editors, vol. 2, Chapter 11, Artech House 1989.

* cited by examiner

Primary Examiner—Robert H. Kim
Assistant Examiner—Thomas R Artman
(74) Attorney, Agent, or Firm—Burns, Doane, Swecker & Mathis, L.L.P.

(57) ABSTRACT

A fiber-optic current sensor has a reflection interferometer having a fiber-optic supply lead and a coil-shaped optical sensor fiber, the sensor fiber being connected with a first end to the fiber-optic supply lead, and being provided at a second, free end with a reflector. The fiber-optic supply lead has two fiber arms, which interconnect a detector-side and a sensor-side polarization-maintaining coupler. A phase modulator for modulating differential phases of two polarized waves propagating in the supply lead fiber is arranged in one of these two fiber arms, in which it modulates the differential phase of two waves polarized parallel to one another. Moreover, the sensor can change the direction of polarization in one of the two fiber arms, such that optical waves with orthogonally linear polarizations propagate in a segment of the supply lead fiber adjoining the sensor-side coupler. As a result, the advantages of the reflection interferometer can be combined with those of a Sagnac interferometer.

9 Claims, 6 Drawing Sheets

FIBER-OPTIC CURRENT SENSOR

This application claims priority under 35 U.S.C. §§119 and/or 365 to Appln. No. 100 21 669.2 filed in Germany on May 5, 2000; the entire content of which is hereby incorporated by reference.

BACKGROUND OF THE INVENTION

The invention relates to a fiber-optic current sensor having a reflection interferometer.

The invention relates to a fiber-optic current sensor having a reflection interferometer in accordance with the preamble of patent claim 1.

A generic fiber-optic current sensor is disclosed in DE-A-4 224 190 and G. Frosio et al., "Reciprocal reflection interferometer for a fiber-optic Faraday current sensor", Applied Optics, Vol. 33, No. 25, pages 6111–6122 (1994). It has a magneto-optically active sensor fiber which is wound in the form of a coil and surrounds an electric conductor. The sensor fiber is silvered at one end, and at the other end it is connected via a phase-retarding element to a polarization-maintaining optical supply lead fiber via which light can be launched into or outcoupled from the sensor fiber. In this arrangement, the supply lead fiber propagates orthogonally linearly polarized optical waves. Before entry into the sensor coil, the latter are converted into two circularly polarized waves with the aid of fiber-optic phase retarders, the two circularly polarized waves having a mutually opposite direction of rotation. After traversing the sensor coil, the two circular waves are reflected at the end of the coil, thereafter returning with exchanged directions of polarization through the coil.

If the current now flows through the electric conductor, the magnetic field of the current effects a differential phase shift between the two circular optical waves. This effect is termed the magneto-optic or Faraday effect. Owing to the twofold traversal of the coil, the waves accumulate a differential phase shift of $\Delta\Phi_s = 4\, V N I$, V denoting the Verdet's constant of the fiber, N the number of fiber turns in the coil, and I the current through the electric conductor.

Upon emerging from the coil in the phase retarders, the circular waves are to be converted into orthogonally linear polarized waves and guided to a detection system via the supply lead fibers. The phase shift caused by the current can be detected by causing the two reflected linearly polarized waves to interfere in a polarizer connected to the supply lead fiber.

In order to obtain a finer resolution in the detection of the differential phase shift, the effective operating point of the interferometer must be situated in a linear range of its cosinusoidal interference function. The differential phase of the two interfering linearly polarized waves is modulated in order to achieve this. The supply lead fiber is operationally connected to a modulator for this purpose. A piezoelectric ceramic operated at resonance and around which a few turns of the supply lead fiber are wound is generally used as modulator. The modulator modulates the birefringence of the fiber and thus the differential phase of the two waves. The frequency of the modulation is typically in the range of 100 kHz and a few MHz and is determined, inter alia, by the length of the fiber connection at the sensor fiber, that is to say the supply lead fiber.

However, it is difficult in practice to use a piezoelectric ceramic to modulate the differential phase of two orthogonal optical waves with a sufficiently large amplitude. In the prior art, recourse is therefore made to a combination of measures in order to achieve the desired amplitude. Thus, in the region of the modulator the supply lead fiber, generally provided with an elliptical core, is replaced by a section of a more sensitive fiber with the stress-induced birefringence. A high modulator voltage is used, and a hollow cylinder is employed as piezoelectric ceramic instead of a disk-shaped element. However, these measures lead to various disadvantages: thus, more sensitive fibers with stress-induced birefringence are more dependent on temperature, are not widely available on the market, are expensive and, moreover, are in some ways difficult to splice with other types of fiber. Again, a fiber with stress-induced birefringence constitutes an additional component in the sensor, and this increases the complexity of the design. The high modulator voltage leads to a strong mechanical loading of the ceramic and thereby impairs the stability and the service life. Finally, the hollow cylindrical ceramic has a lower resonant frequency than the disk-shaped one, and this results in a lower useful bandwidth of the sensor. Moreover, a longer supply lead fiber has to be used, since the length of the modulation frequency must be matched.

A fiber-optic current sensor having another interferometer, a so-called Sagnac interferometer is known from G. Frosio et al., "All-fiber Sagnac Current Sensor", Proc. Opto 92, pages 560–564 (1992) and EP-A-0 856 737. In the Sagnac interferometer, two oppositely directed light waves are propagated in a closed optical circuit. The two waves are polarized circularly in the sensor coil and linearly in the two connecting fibers of the coil. The linear polarizations are aligned parallel to one another in this case. By comparison with orthogonally polarized waves, the modulation of the differential phase of two oppositely directed waves with parallel polarization requires 100 to 1000 times less piezoelectric deformation of the modulator, and so that above-named disadvantages of the reflection interferometer are not present. The sensor with the Sagnac interferometer has the disadvantage, however, that it is vulnerable to mechanical vibrations. This is due, inter alia, to the finite propagation time of the waves in the optical circuits, since the two waves reach the location of a disturbance at different times, and to the inherent sensitivity of the Sagnac interferometer to rotational movements.

The phase modulation of the oppositely directed waves in the Sagnac current sensor is performed in an entirely analogous fashion to the modulation of the oppositely directed waves in a fiber gyro for measuring rotational speeds, such as described in H. C. Lefevre, "fiber-optic gyroscopes", Fiber-Optic Sensors, J. Dakin and B. Culshaw Editors, Vol. 2, Chapter 11, Artech House 1989.

It is the object of the invention to create a fiber-optic current sensor having a reflection interferometer of the type mentioned at the beginning which can be modulated in a simple way.

SUMMARY OF THE INVENTION

The differential phase of two oppositely directed, parallel linear polarized waves is modulated in the current sensor according to the invention. In order to permit this, a section of a fiber-optic supply lead of the current sensor according to the invention has two fiber arms, the two fiber arms interconnecting two fiber couplers. Propagating in the two fiber arms are linearly polarized waves which are converted into orthogonal polarizations in one of the couplers before they reach the coil-shaped optical sensor element. The orthogonal polarizations returning from the sensor coil are once again split in the second coupler between the two fiber arms and reunited in the first coupler. Means are present for changing the direction of polarization with respect to the fiber axes in one of the fiber arms. The modulation is performed in one or both of the fiber arms.

Since the separation of the fiber-optic supply lead takes place only over a short distance, the signal is virtually uninfluenced by mechanical vibrations.

Waves with linear polarization can propagate in the two fiber arms parallel to the long and short axes of the fiber core. However, at least one, and in a selected embodiment even both, fiber arms preferably have a polarizer such that only a single direction of polarization is present in the fiber arm.

The means for changing the direction of polarization with reference to the axes of the fiber core is preferably a 90° splice which connects two fiber segments in one of the two fiber arms.

In a preferred embodiment, a detector and a light source are connected to the same fiber segment of a fiber coupler. This arrangement is suitable, in particular, for measuring direct currents.

The current sensor according to the invention can be multiplexed in a simple way by supplying a plurality of coil-shaped sensor fibers from the same fiber-optic supply lead. For this purpose, the fiber-optic supply lead has an appropriate number of further fiber arms, which are arranged in series with the first two fiber arms.

BRIEF DESCRIPTION OF THE DRAWINGS

The subject matter of the invention is explained in more detail below with the aid of preferred exemplary embodiments which are illustrated in the attached drawings, in which.

DETAILED DESCRIPTION OF THE PREFERRED EMBODIMENTS

Figure 1:
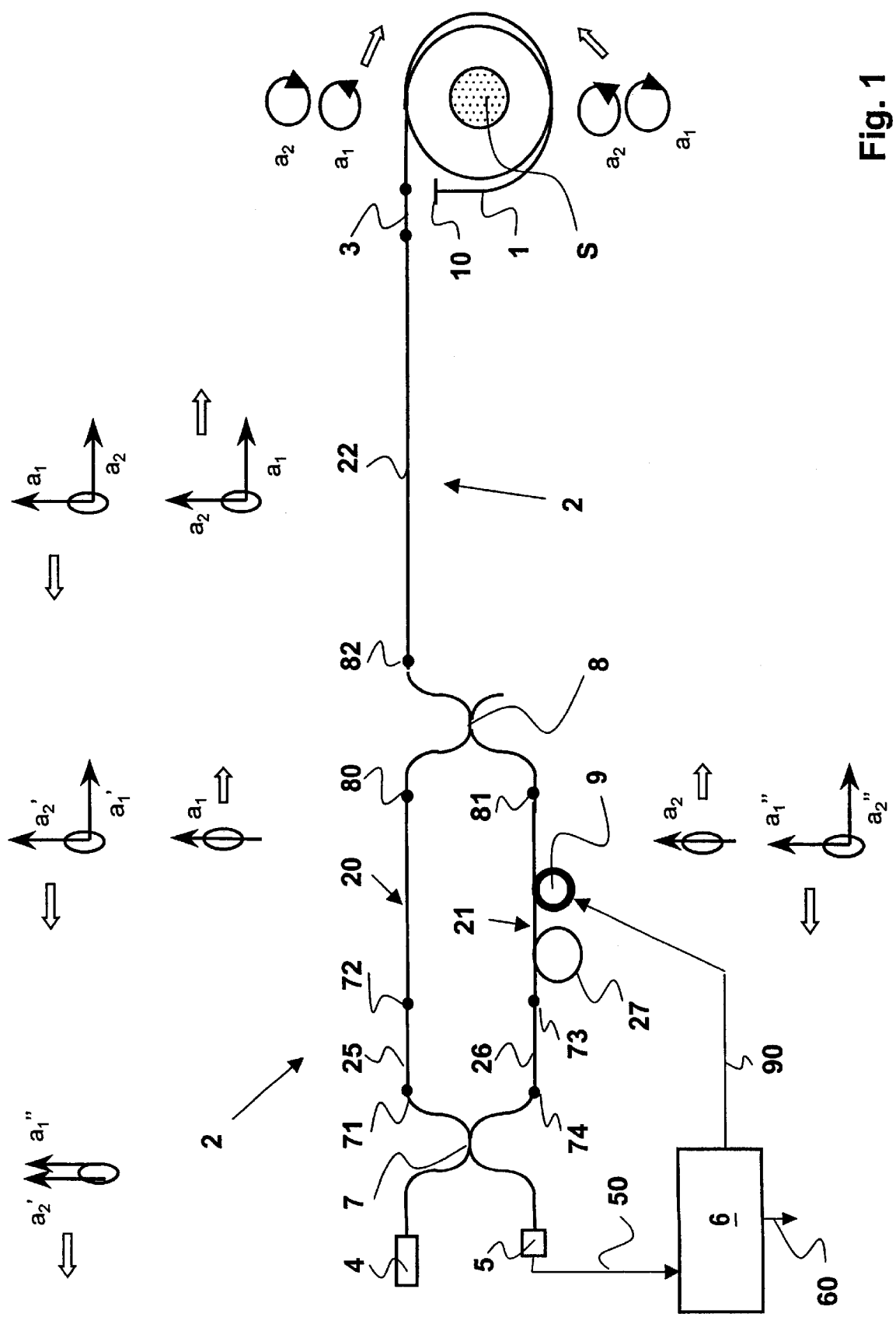
FIG. 1 shows a schematic of a current sensor according to the invention, in a first embodiment.

FIG. 1 shows a fiber-optic current sensor having a reflection interferometer. A sensor fiber 1 is wound in a shape of a coil around an electric conductor S. It preferably has a round core cross section and is preferably produced from quartz glass. A first end of the sensor fiber 1 is connected to a fiber-optic supply lead 2. A second end is provided with a reflector 10. Generally, the reflector 10 is formed by soldering the second fiber end. Substantially, and with the exception of the splitting of the supply lead according to the invention, the fiber-optic supply lead 2 consists of a birefringent optical fiber which is at least partially of polarization-maintaining design. It preferably has an elliptical core cross section in order to produce the birefringence. However, it is possible to use a stress-induced birefringent fiber. The fiber-optic supply lead 2 is connected to the sensor fiber 1 via a phase-retarding element 3, a λ/4 phase-retarding fiber segment preferably being used for this purpose.

Also present is a light source 4, whose light is transmitted by the fibers. Particularly suitable as light source are those with a small coherence length, in particular a superluminescent diode, a laser diode operating below the laser threshold, an LED or a broadband fiber light source. The sensor has a detector 5, in particular a photodiode, which is propagated through the sensor fiber and a fiber-optic supply lead and detects light caused to interfere. This detector 5 is connected via a detector signal line 50 to a signal processor 6 which transmits the sensor signal via a sensor signal line 60 to an electronic evaluation unit (not illustrated).

According to the invention, the fiber-optic supply lead 2 is separated over a specific length in two fiber arms 20, 21, which are therefore connected in parallel. The fiber arms 20, 21 interconnect a detection-side and a sensor-side polarization maintaining coupler 7, 8. In the preferred exemplary embodiment illustrated here, these two couplers 7, 8 are fiber couplers with an elliptical core. However, it is also possible to use other types of couplers. Furthermore, polarizers 25, 26 are present in the two fiber arms 20, 21 being directed such that their directions of polarization are parallel to one of the main axes of the arms 20, 21. They are preferably directed parallel to the long or slow main axis of the core of the fiber arm 20, 21. However, it is also possible for them to be directed parallel to the short or fast main axis, or to be aligned respectively one to the long and one to the short axis.

Use is made in this example of fiber polarizers, but it is also possible to use other polarizers. The fiber arms 20, 21 are connected on the detector side via splices 72, 73 to the polarizers 25, 26, the latter are connected via splices 71, 74 to the detector-side couplers 7. On the sensor side, the fiber arms 20, 21 are likewise connected to the sensor-side coupler 8 via splices 80, 81. Similarly, a sensor-side segment 22 of the fiber-optic supply lead 2 is connected to the coupler 8 via a splice 82.

One of the two fiber arms 20, 21 further preferably has a time-delay element, in the form of a fiber loop 27 here. Likewise present on one of the two fiber arms 20, 21 is a phase modulator 9, which is connected to the signal processor 6 via a modulation signal line 90. In the exemplary embodiment illustrated here, both the phase modulator 9 and the time-delay element 27 are arranged on the same fiber arm 21. A piezoelectric modulator is preferably used as phase modulator 9, a part of the fiber arm 21 being wound around a piezoelectric body of the modulator. However, it is also possible to use other modulators, in particular an integrated optical modulator which is based on an electrooptic effect in a waveguide.

The individual directions of polarization with reference to the axes of the fiber core of the waves propagating in the fibers are illustrated with narrow arrows in FIG. 1. In addition, broad arrows specify the direction of propagation of the waves. Light which is emitted by the light source 4 is split in the detector-side fiber coupler 7 to a first and a second wave $a_1$, $a_2$ between two fiber arms 20, 21 of the fiber-optic supply lead 2. The splitting ratio is preferably 1:1 in this case. The light is linearly polarized in the two fiber-optic polarizers 25, 26 and is then propagated to the remaining polarization-maintaining fiber arm 20, 21 to the sensor-side coupler 8. The optical waves propagating in the direction of sensor fiber 1 in the fiber arms 20, 21 in this case have directions of polarization which are aligned in this example parallel to the large main axis of the fiber core. The corresponding arrows are denoted in FIG. 1 by $a_1$, and $a_2$.

The waves are now launched into the two inputs of the sensor-side coupler 8 such that their polarizations are aligned orthogonally relative to one another after leaving the coupler, that is to say in the segment 22 of the fiber-optic supply lead 2. For this purpose, one wave is launched with the polarization parallel to the long axis, and the other with the polarization parallel to the small axis of the coupler inputs. For this purpose, a means is present between one fiber arm, here the first fiber arm 20, and a coupler, here the sensor-side coupler 8, in order to vary the direction of polarization relative to the fiber axes. Light which vibrates parallel to the long axis before traversing these means vibrates parallel to the short axis after the traversal, and light which vibrates parallel to the short axis before traversing this means vibrates parallel to the long axis after the traversal.

In the example in accordance with FIG. 1, this means is the splice 80 between the fiber arm 20 and fiber coupler 8 which is designed as a 90° splice. That is to say, the fibers of the first fiber arm 20 and of the fiber coupler 8 are joined together at the splice 80 such that the long main axes of their cores are aligned orthogonally, at least approximately. By contrast, the splice 81, which joins the second fiber arm 21 to the fiber coupler 8 is a 0° splice, that is to say the long main axes of the core of the fibers are aligned parallel to one another, at least approximately. Two waves with orthogonal linear polarizations then run in the sensor-side segment 22, adjoining the coupler 8, of the fiber-optic supply lead 2. This is likewise illustrated in FIG. 1 with arrows. During the subsequent traversal of the fiber-optic $\lambda/4$ time-delay element, they are converted into left-circular and right-circular waves, as may be seen in FIG. 1. The circular waves traverse the sensor fiber 1, are reflected at the coil end 10, exchange their states of polarization in the process, return through the coil and are reconverted in the $\lambda/4$ retarder into orthogonal linear waves whose polarization is now perpendicular to the polarization of the corresponding waves of the forward direction.

In the sensor-side coupler 8, each of the two orthogonal waves is split between the two fiber arms 20, 21, the first wave $a'_1$ being split into the returning waves $a'_1$ and $a''_1$, and the second wave $a_2$ being split into returning waves $a'_2$ and $a''_2$. In this case, the returning waves $a''_1$ and $a'_2$ vibrate in the two fiber arms 20, 21 parallel to the advancing waves $a_1$ and $a_2$. These returning waves $a''_1$ and $a'_2$ originate from waves which have moved during their forward propagation in the respective other fiber arm. The returning waves $a'_1$ and $a''_2$, which vibrate in the two fiber arms 20, 21 in a fashion orthogonal to the advancing waves $a_1$ and $a_2$, originate from waves which have moved respectively in the same fiber arm during forward propagation. The returning waves $a''_1$ and $a'_2$ can pass the fiber polarizers 25, 26, are caused to interfere in the detection-side coupler 7 and, finally, are detected in the detector 5. The waves $a'_1$ and $a''_2$ orthogonal thereto are blocked in the polarizers 25, 26.

The two fiber arms 20, 21 preferably have an optical length difference $\Delta L$, and this is achieved in the examples described here by the time-delay element 27 and/or by the part of the fiber segment wound around the piezoelectric crystal. This optical length difference AL is larger in this case than the coherence length of the light source 4. If the returning waves $a'_1$ and $a''_2$ are not completely extinguished in the polarizers 25, 26, because of their path difference of 2$\Delta L$ in total they cannot interfere in the detection-side coupler 7, and therefore make no interfering contribution to the measurement signal. The delay path can also be minimized by selecting a light source with a small coherence length.

The waves $a''_1$ and $a'_2$ interfering at the detection-side coupler 7 have a phase difference $\Delta \phi$ of zero in the case of no current. The operating point of the interferometer is then at a maximum of the cosinusoidal interference function. The sensitivity of the interferometer is very low here. The phase modulator now modulates the differential phase of the interfering waves, that is to say $a''_1$ and $a'_2$, by analogy with the fiber gyro, which has been mentioned in the introduction of the description. In this case there is dynamic phase modulation in the case of which a non-reciprocal phase modulation is achieved by modulating oppositely directed waves. The effective operating point is selected such that it is situated in the linear range of the cosinusoidal function. The vibration frequency and amplitude of the phase modulator are preferably selected such that the amplitude $\eta_0$ of the differential phase modulation is 1.84 rad, and thereby corresponds to the position of the maximum of the Bessel function of first order.

The fiber arms 20, 21 with the couplers 7, 8 form an optical gyro, that is to say a rotation of the arrangement leads likewise to a differential phase shift between the interfering waves $a''_1$ and $a'_2$. The phase shift is greater, the greater the area enclosed by the two arms 20, 21. In order to avoid such interfering signals, the fiber arms 20, 21 are preferably laid such that the area enclosed by them is as small as possible, being equal to zero in the ideal case.

The same effect also occurs in the fiber turns which are wound onto the piezoelectric modulator 9, and/or in the time-delay loops 27. It is possible in this case to compensate rotation-induced phase shifts by winding a segment of the fiber arms 20 or 21 with a reversed direction of rotation for the purpose of balancing. The number of the turns and the area enclosed are selected so as to achieve compensation which is as complete as possible.

Figure 2:
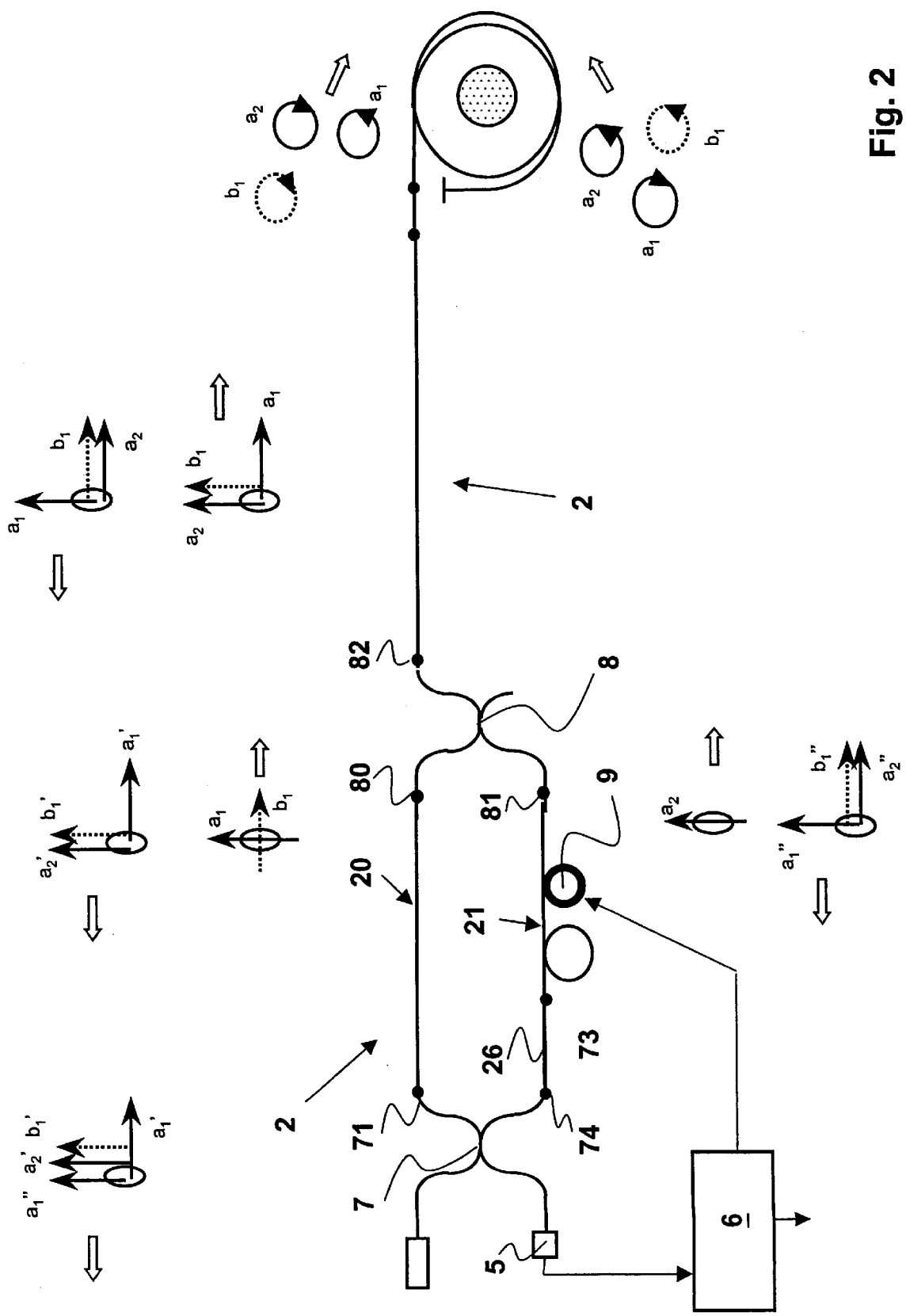
FIG. 2 shows a current sensor according to the invention in a second embodiment.

A second exemplary embodiment of the current sensor according to the invention is illustrated in FIG. 2. The design is essentially the same as in the preceding example, but a fiber polarizer 26 is present only in the second fiber arm 21. Consequently, a third wave $b_1$ is propagated in the first fiber arm 20, as may be seen in the figure by way of the directions of polarization of the waves.

Only four returning waves, specifically $a''_1$, $a'_2$, $b'_1$, and $a'_1$ reach the detector. In this case, the waves $a''_1$ and $a'_2$ are coherent. The sensor signal is obtained again from their interference. The returning third wave $b'_1$ has a path difference of $\Delta L$ with reference to $a''_1$ and $a'_2$, and therefore does not interfere with $a''_1$ and $a'_2$, but merely supplies a constant background intensity. The returning first wave $a'_2$, admittedly has no path difference by comparison with $b'_1$, but because of its orthogonal polarization it likewise supplies only a phase-independent background intensity.

Figure 3:
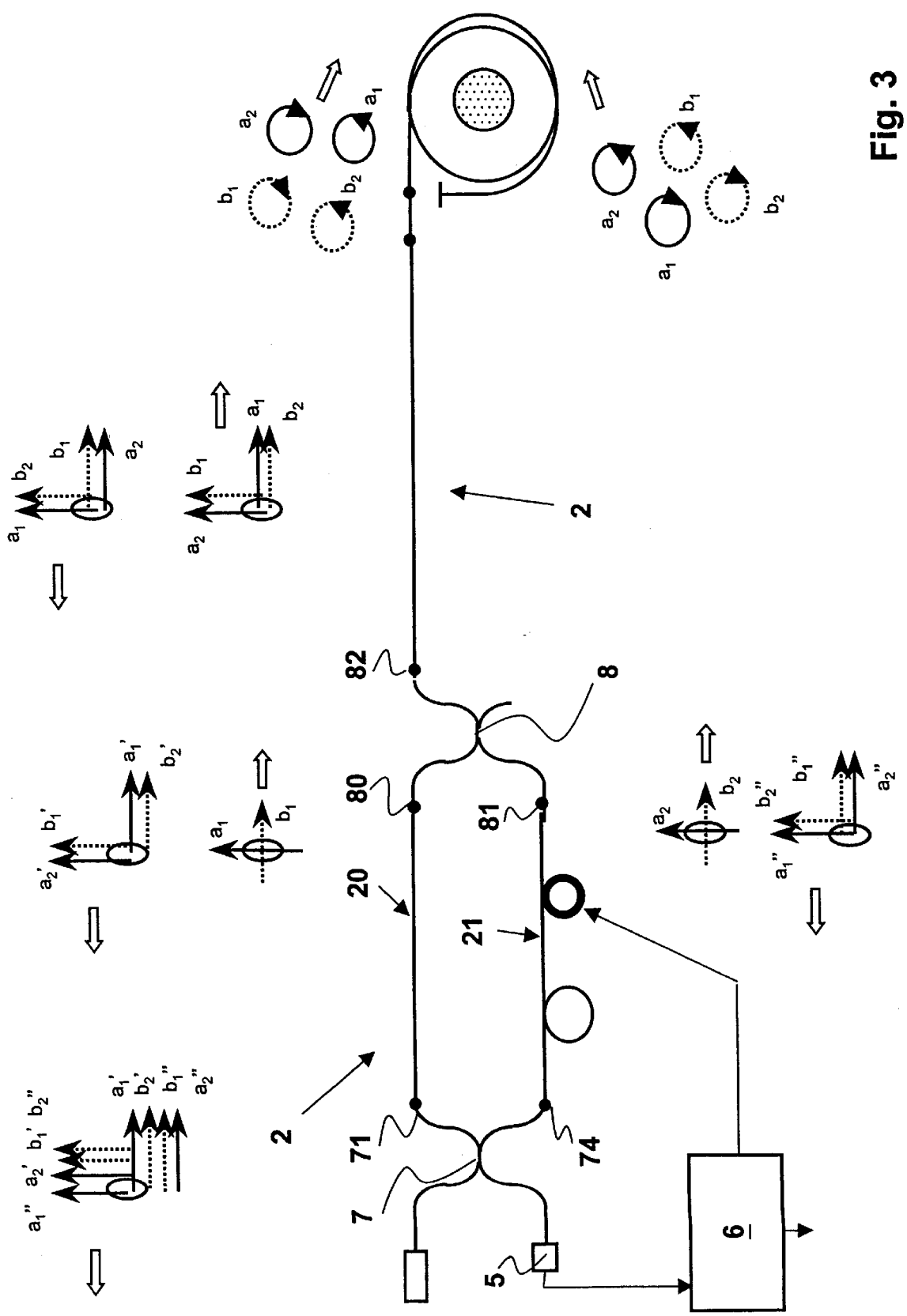
FIG. 3 shows a current sensor according to the invention in a third embodiment.

Illustrated in FIG. 3 is a third exemplary embodiment, which has no polarizers at all in the fiber arms 20, 21, and so a fourth wave $b_2$ is present. Both polarizations are excited in the fiber arms 20, 21 and sent to the sensor fiber 1, and so a total of eight returning waves $a''_1$, $a'_2$, $b'_1$, $b''_2$, $a'_1$, $b'_2$, $b''_1$, $a''_2$ arrive at the detector 5. In each case four waves $a''_1$, $a'_2$, $b'_1$, $b''_2$ are parallel to the long main axis and four waves $a'_1$, $b'_2$, $b''_1$, $a''_2$ are parallel to the short main axis of the fiber core. The two waves $a''_1$ and $a'_2$ with the polarization parallel to the long axis are coherent. Their interference yields a sensor signal. The waves $b''_2$ and $b'_1$ have path differences with reference to $a''_1$ and $a'_2$ of +$\Delta L$ and of −$\Delta L$, respectively, and therefore supply no signal contribution. In addition, the modulator 9 does not have its differential phase, or is modulated only with a very small amplitude. The two waves $b''_1$ and $b'_2$ with polarization parallel to the short axis are likewise coherent. Their interference therefore likewise yields a signal contribution. The waves $a''_2$ and $a'_1$ again have path differences with reference to $b''_1$ and $b'_2$ of +$\Delta L$ and −$\Delta L$, and therefore supply no signal contribution. The relative signal contributions of $a''_1$ and $a'_2$ and, respectively, of $b''_1$ and $b'_2$ are different as a rule, since the modulator 9 modulates the differential phase of the two pairs of waves with a different amplitude because of their different directions of polarization. If desired, the waves of one of the two directions of polarization can be blocked upstream of the detector with the aid of a polarizer (not illustrated here).

Figure 4:
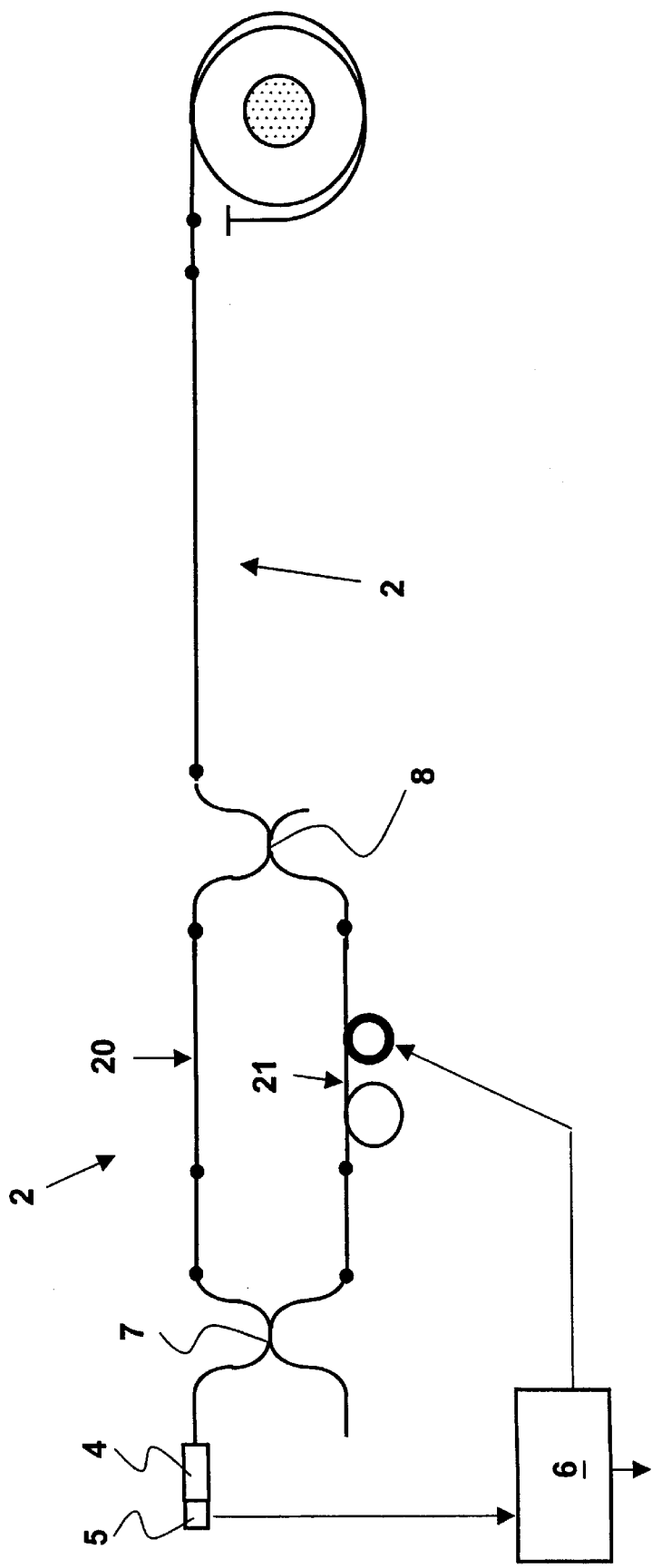
FIG. 4 shows a current sensor according to the invention in a fourth embodiment.

In the embodiments described so far, the detector 5 is arranged at a fiber end of the detection-side fiber coupler 7 which is separated from a light source 4. However, it is also possible, as illustrated in FIG. 4, to detect the returning, interfering waves at an input arm of the coupler 1 connected to the light source 4. In this case, the detector 5 is arranged downstream of the light source 4, and therefore at the same input or output of the coupler 7. This arrangement is possible for all previously described embodiments. With this arrangement, the detection-side coupler 7 is traversed in a reciprocal way by the advancing and also by the returning waves, that is to say regarding the coupler in a fashion analogous to a beam splitter, each wave is reflected once and transmitted once at the coupler. The total differential phase shift of the waves at the detection-side coupler 7 is therefore exactly zero. In the embodiments in accordance with FIGS. 1 to 3, the waves traverse the detection-side coupler 7 in a non-reciprocal fashion, by contrast. One wave is reflected twice, the other transmitted twice. It is possible, as a result thereof, for a differential phase shift to occur which cannot be distinguished from the phase shift which a direct current produces. The embodiment in accordance with FIG. 4 is therefore particularly suitable for measuring direct currents.

Figure 5:
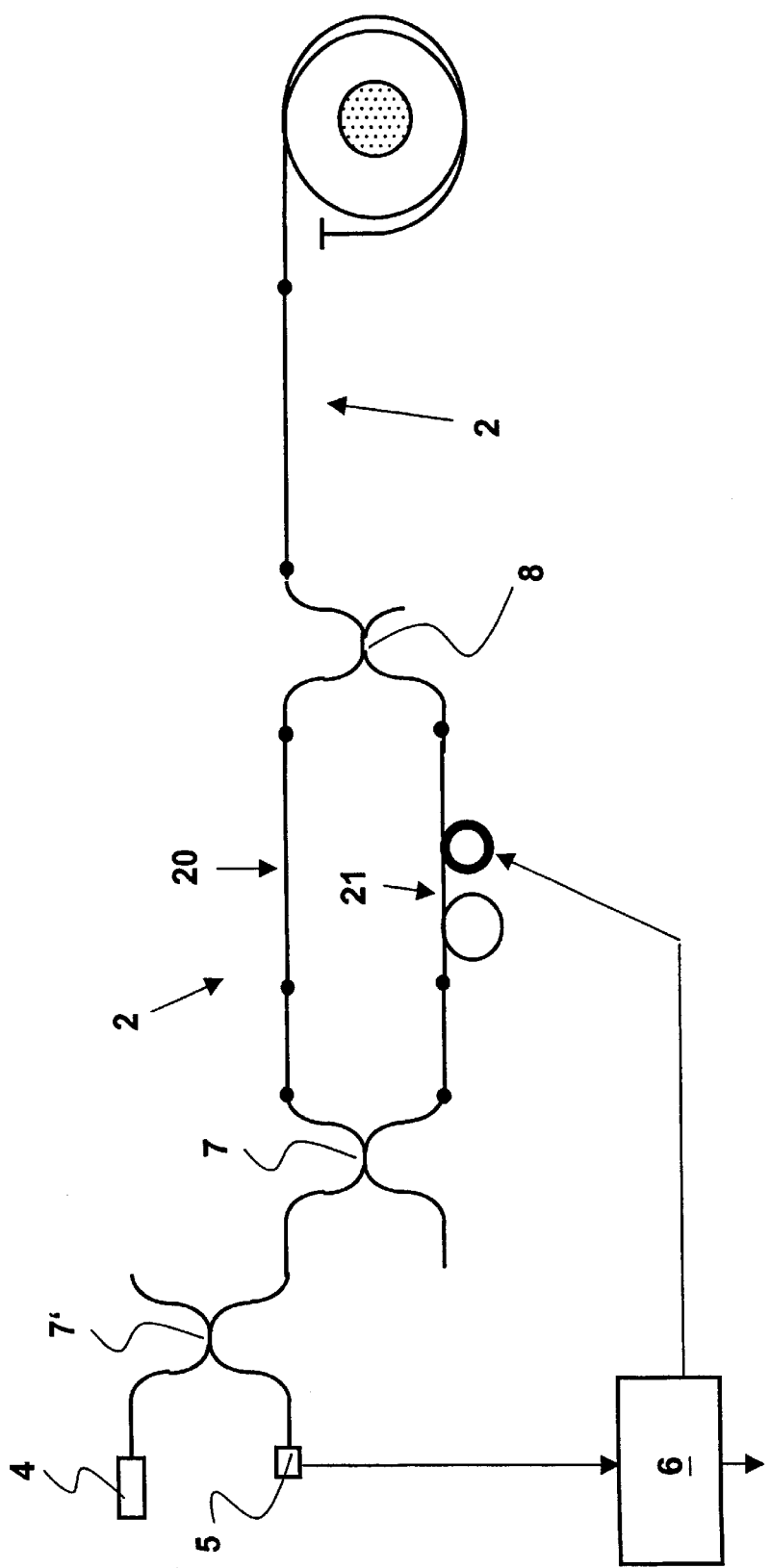
FIG. 5 shows a current sensor according to the invention in a fifth embodiment.

FIG. 5 shows a modification of the fourth exemplary embodiment in a fifth one. Here, a third coupler 7', preferably likewise a fiber coupler, is arranged between the light source 4 and detection-side coupler 7. This configuration again permits reciprocal optical paths for the two interfering waves. As in the exemplary embodiments in accordance with FIGS. 1 to 3, the waves are, however, detected with a detector 5 separated from the light source 4. An advantage by comparison with the fourth exemplary embodiment consists in that the detector 5 is not exposed to the direct laser light. The rather disturbing background direct current in the photodiode signal is therefore substantially lower.

Further variants of the above-named exemplary embodiments are possible. Thus, the modulator, time-delay loop and polarizers can be distributed between the two fiber arms. The means for varying the polarization can also be arranged at different points. Thus, instead of the splice 80 described with the aid of FIG. 1, one of the other splices 71, 72, 26, 73, 81 illustrated can also be fashioned at a 90° splice. A plurality of the splices can also be designed as 90° splices. Their number must only be odd. Furthermore, phase modulators can be used in both fiber arms. This has the advantage that a reduction in the required modulation intensity is once again achieved. Furthermore, a coil-shaped integrated optical sensor element can be used instead of a coil-shaped sensor fiber. The coil can consist of only a single turn in both cases.

Figure 6:
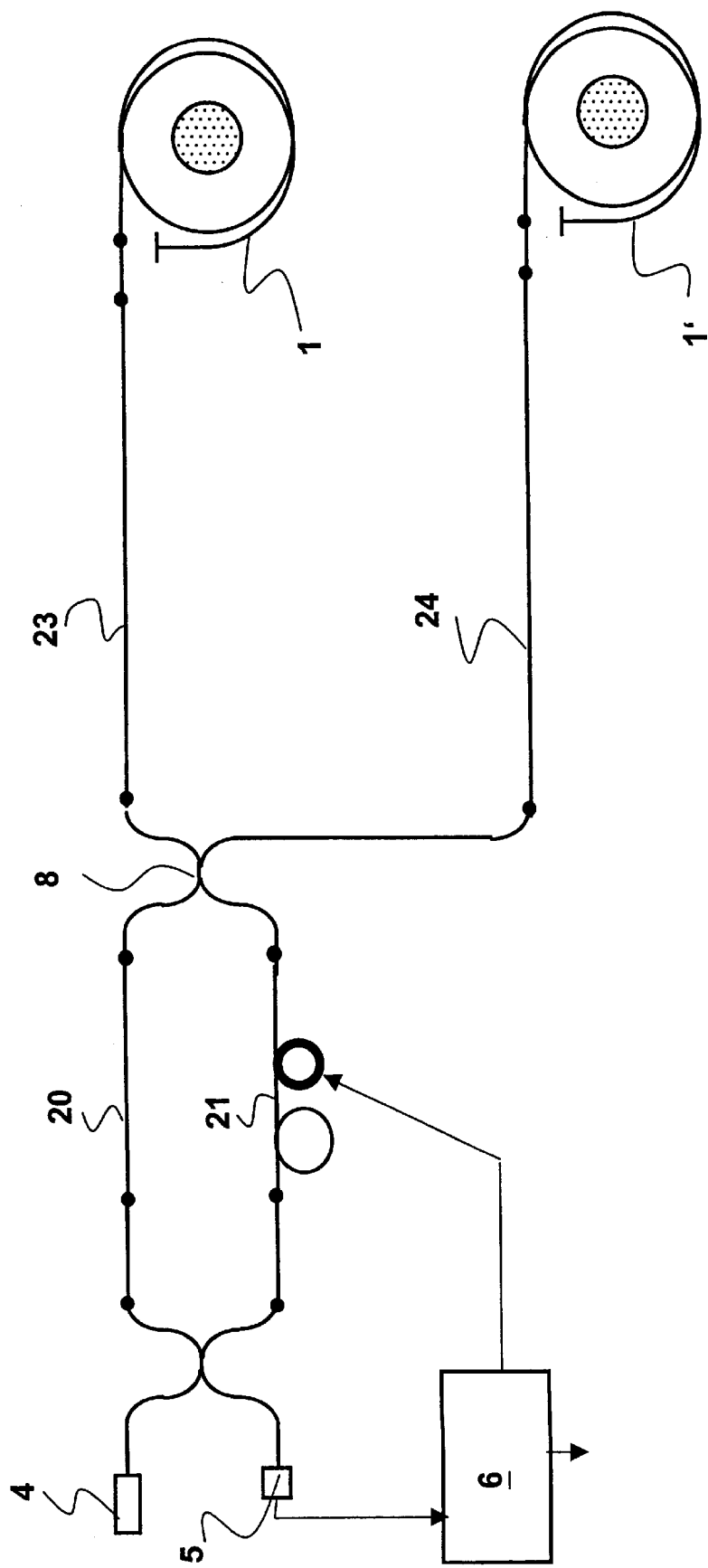
FIG. 6 shows a current sensor according to the invention in a sixth embodiment.

Multiplexing of the sensor is illustrated in a sixth exemplary embodiment, in FIG. 6. A plurality of, here two coil-shaped sensor fibers 1, 1' are present, being connected to the same fiber-optic supply lead 2. The supply lead fiber 2 has for this purpose a corresponding number of, here two, further fiber arms 23, 24 which are arranged in series with the two first fiber arms 20, 21. Here, a third fiber arm 23 is connected to a first output of the sensor-side fiber coupler 8, and a fourth fiber arm 24 is connected to a second output. Each sensor fiber 1, 1' is therefore connected to an additional fiber arm 23, 24. Additional fiber arms 23, 24 are of different lengths, and so the signals of the two sensor fibers 1, 1' can differ on the basis of the different propagation times of the corresponding optical waves. In order to facilitate such time-division multiplexing, the emission of the light source 4 is either pulsed or frequency-modulated, the modulation frequency being varied in the second case as a function of time, for example in a saw-tooth fashion.

The two sensor fibers 1, 1' are preferably fitted with a different number of fiber turns. The sensor fiber with fewer turns can then preferably be used for measuring high currents in the case of short circuits, thus taking on a protector function. The other sensor fiber, with the larger number of turns, can be used for accurate measurement of the relatively small currents in normal operation.

The current sensor according to the invention combines the advantages of a reflection interferometer with those of a Sagnac interferometer, and although only a single fiber serves as supply lead fiber and return fiber, it has two arms over a short distance and therefore permits the use of waves polarized linearly in parallel.

What is claimed is:

1. An optical current sensor having a reflection interferometer which has a fiber-optic supply lead and a coil-shaped optical sensor element, the sensor element being connected with a first end to the fiber-optic supply lead and being provided at a second, free end with a reflector, having at least one phase modulator for modulating differential phases of two polarized waves propagating in the fiber-optic supply lead, and a detector, wherein the fiber-optic supply lead has two fiber arms which interconnect a detector-side and a sensor-side coupler, in that the at least one phase modulator is arranged in one of these two fiber arms, in which case it modulates the differential phase of two oppositely directed waves polarized parallel to one another, and wherein one fiber arm is provided with a means for changing the direction of polarization such that optical waves with orthogonally linear polarizations propagate in a segment of the supply lead fiber adjoining the sensor-side coupler, wherein the means for changing the direction of polarization is a 90° splice.

2. The current sensor as claimed in claim 1, wherein at least one of the fiber arms has a polarizer for producing a linear polarized optical wave.

3. The current sensor as claimed in claim 2, wherein both fiber arms have a polarizer for producing optical waves with linear polarizations directed parallel to one another.

4. The current sensor as claimed in claim 1, wherein the 90° splice is arranged between the sensor-side coupler and the one fiber arm.

5. The current sensor as claimed in claim 1, wherein the detector and a light source generating the optical waves are arranged at a common input or output of the detector-side coupler.

6. The current sensor as claimed in claim 5, wherein a third coupler is arranged between the light source and detector-side coupler, and wherein the light source and the detector are arranged at different inputs and outputs of the third coupler.

7. The current sensor as claimed in claim 1, wherein a plurality of coil-shaped sensor elements are present, and wherein the fiber-optic supply lead has further fiber arms which are arranged in series with the two fiber arms, each coil-shaped sensor element being connected to one of the further fiber arms.

8. The current sensor as claimed in claim 7, wherein the further fiber arms have different lengths.

9. The current sensor as claimed in claim 8, wherein the coil-shaped sensor elements have a different number of fiber turns.

* * * * *